(12) United States Patent
Knight

(10) Patent No.: US 7,043,933 B1
(45) Date of Patent: May 16, 2006

(54) SPRAY COOLANT RESERVOIR SYSTEM

(75) Inventor: Paul A. Knight, Spokane, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 46 days.

(21) Appl. No.: 10/649,327

(22) Filed: Aug. 26, 2003

(51) Int. Cl.
*F25D 23/12* (2006.01)

(52) U.S. Cl. ............... 62/259.2; 62/310; 361/688; 361/689

(58) Field of Classification Search ......... 62/310, 62/304, 305, 64, 376, 121, 171, 259.2; 361/688, 361/689, 698, 699
See application file for complete search history.

(56) References Cited

U.S. PATENT DOCUMENTS

| | | | | |
|---|---|---|---|---|
| 2,845,472 A * | 7/1958 | Narbut | ............... | 174/15.1 |
| 3,406,244 A | 10/1968 | Oktay | ............... | 174/15 |
| 4,213,827 A * | 7/1980 | Calderon | ............... | 201/39 |
| 4,399,484 A | 8/1983 | Mayer | ............... | 361/382 |
| 4,476,687 A * | 10/1984 | Conklin et al. | ............... | 62/64 |
| 4,493,010 A | 1/1985 | Morrison et al. | ............... | 361/385 |
| 4,857,090 A * | 8/1989 | Hartness | ............... | 62/91 |
| 4,912,600 A | 3/1990 | Jaeger et al. | ............... | 361/385 |
| 4,967,829 A | 11/1990 | Albers et al. | ............... | 165/1 |
| 5,057,968 A | 10/1991 | Morrison | ............... | 361/385 |
| 5,177,666 A | 1/1993 | Bland et al. | ............... | 361/382 |
| 5,220,804 A | 6/1993 | Tilton et al. | ............... | 62/64 |
| 5,293,754 A | 3/1994 | Mizuno | ............... | 62/185 |
| 5,675,473 A | 10/1997 | McDunn et al. | ............... | 361/699 |
| 5,718,117 A | 2/1998 | McDunn et al. | ............... | 62/64 |
| 5,740,018 A | 4/1998 | Rumbut, Jr. | ............... | 361/720 |
| 5,831,824 A | 11/1998 | McDunn et al. | ............... | 361/699 |
| 5,854,092 A | 12/1998 | Root et al. | ............... | 438/106 |
| 5,880,931 A | 3/1999 | Tilton et al. | ............... | 361/690 |
| 5,907,473 A | 5/1999 | Przilas et al. | ............... | 361/699 |
| 5,943,211 A | 8/1999 | Havey et al. | ............... | 361/699 |
| 5,999,404 A | 12/1999 | Hileman | ............... | 361/699 |
| 6,055,157 A | 4/2000 | Bartilson | ............... | 361/699 |
| 6,055,824 A * | 5/2000 | Kuma et al. | ............... | 62/314 |
| 6,108,201 A | 8/2000 | Tilton et al. | ............... | 361/689 |
| 6,139,361 A | 10/2000 | Przilas et al. | ............... | 439/559 |
| 6,305,180 B1 * | 10/2001 | Miller et al. | ............... | 62/259.2 |

(Continued)

FOREIGN PATENT DOCUMENTS

EP  0 091 733  10/1983

(Continued)

OTHER PUBLICATIONS

High-Performance COTS DSP for Harsh Environment VME Electronics, Tilton, Donald E. et al., COTS Journal, May/Jun. 1999.

(Continued)

*Primary Examiner*—Chen Wen Jiang
(74) *Attorney, Agent, or Firm*—Michael S. Neustel

(57) ABSTRACT

A spray coolant reservoir system for increasing the efficiency and performance of a spray thermal management system. The spray coolant reservoir system includes a reservoir capable of storing a volume of coolant, a chassis with a spray chamber, a pump unit, an intake valve fluidly connected to the pump unit for providing coolant from the reservoir or the spray chamber, an output valve fluidly connected to the pump unit for controlling coolant flow from the pump unit to either the spray unit or the reservoir. The reservoir preferably includes a vent port, a fill port, and a chamber port. The chamber port is fluidly connected to the spray chamber for allowing control of the internal pressure within the spray chamber.

18 Claims, 10 Drawing Sheets

U.S. PATENT DOCUMENTS

| | | |
|---|---|---|
| 6,349,554 B1 | 2/2002 | Patel et al. .................. 62/259.2 |
| 6,392,891 B1 | 5/2002 | Tzlil et al. ................... 361/719 |
| 6,421,240 B1 | 7/2002 | Patel ........................... 361/699 |
| 6,496,375 B1 | 12/2002 | Patel et al. .................. 361/719 |
| 6,550,263 B1 * | 4/2003 | Patel et al. .................. 62/259.2 |
| 6,604,370 B1 | 8/2003 | Bash et al. .................... 62/171 |
| 6,621,707 B1 | 9/2003 | Ishimine et al. ............. 361/721 |
| 6,625,023 B1 * | 9/2003 | Morrow et al. .............. 361/700 |
| 6,646,879 B1 | 11/2003 | Pautsch ....................... 361/699 |

FOREIGN PATENT DOCUMENTS

| | | |
|---|---|---|
| JP | 61-267369 | 11/1986 |
| JP | 2-24531 | 1/1990 |
| WO | WO 01/01741 | 1/2001 |

OTHER PUBLICATIONS

Mist Cooling for Harsh Environment VME, Tilton, Donald E. et al., RTC Magazine, May 1999.

Applying Mist to COTS Convection Modules Is Really Cool, Tilton, Charles, COTS View, 2000.

Spray Cooling for the 3-D Cube Computer, Tilton, Donald E. et al., InterSociety Conference, May 1994.

Spray Cooling Electrical and Electronic Equipment, Tilton, COTS Journal, Nov. 2003.

Parker Advanced Liquid Cooling Systems Team, Parker Aerospace, May 13, 2003.

* cited by examiner

Decreasing Spray Chamber Pressure

Increasing Spray Chamber Pressure

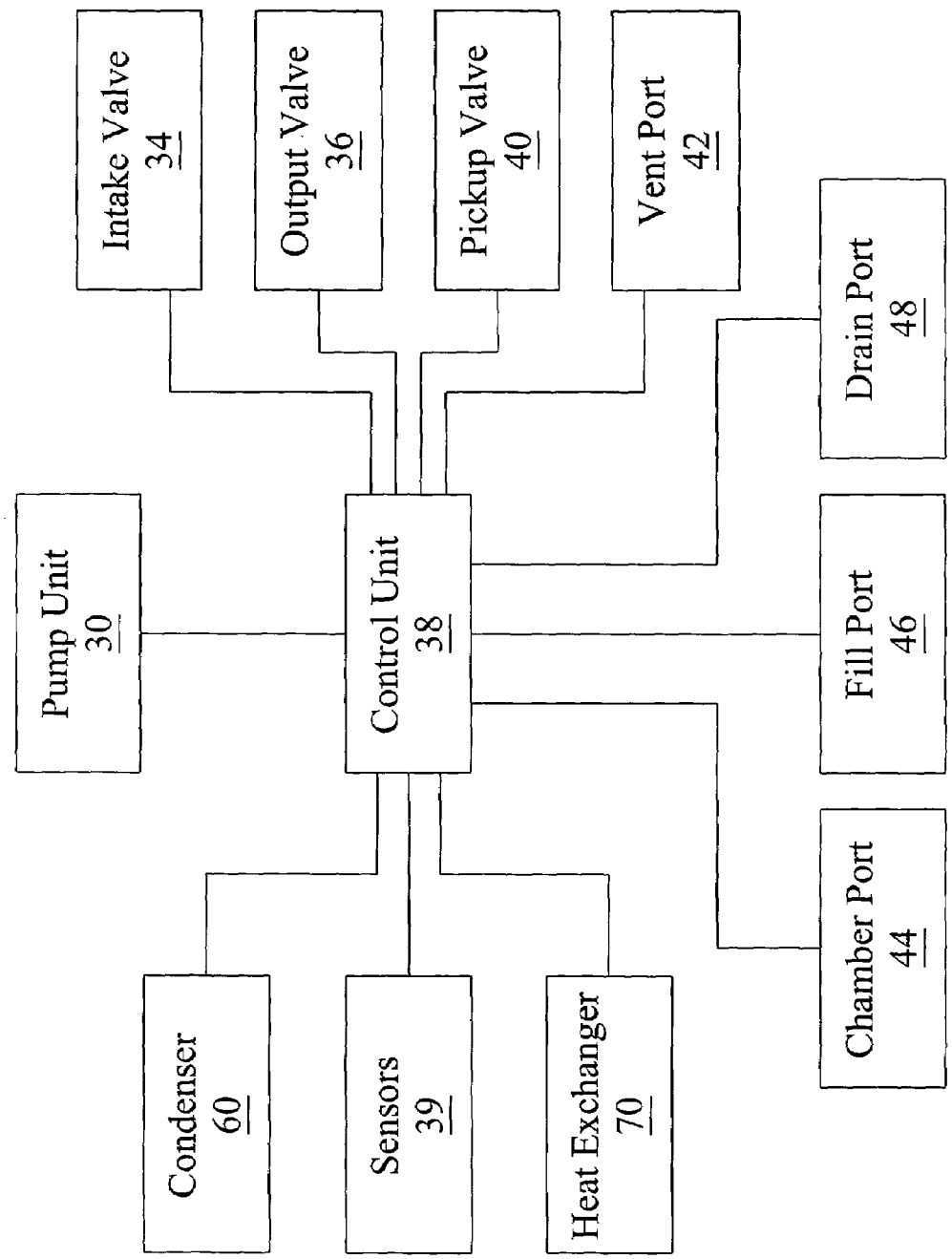

SPRAY COOLANT RESERVOIR SYSTEM

CROSS REFERENCE TO RELATED APPLICATIONS

Not applicable to this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to spray thermal management systems for thermally managing electronic devices and more specifically it relates to a spray coolant reservoir system for increasing the efficiency and performance of a spray thermal management system.

2. Description of the Related Art

Modern electronic devices have increased thermal management requirements. Conventional dry thermal management technology (e.g. fans, vents) simply is not capable of efficiently cooling modern high-end electronics.

Spray thermal management technology is being adopted today as the most efficient option for thermally managing electronic systems. U.S. Pat. No. 5,220,804 entitled High Heat Flux Evaporative Spray Cooling to Tilton et al. describes the earlier versions of spray technology. U.S. Pat. No. 6,108,201 entitled Fluid Control Apparatus and Method for Spray Cooling to Tilton et al. also describes the usage of spray technology to cool a printed circuit board. Spray thermal management may be performed locally (i.e. where the chip is sprayed directly), globally (i.e. where the chip and surrounding electronics/boards are also sprayed), a combination of locally and globally, or in conjunction with air cooling or other cooling methods.

One problem with conventional spray technology is that excess coolant is often times retained within the spray chamber to ensure adequate coolant return flow to the pump and to compensate for any coolant leakage. This excess coolant can interfere with the thermal management of electronic devices within the spray chamber. In addition, this excess coolant can also directly impact and damage the electronic components during attitude changes, deceleration and acceleration of the spray chamber.

Another problem with conventional spray technology is that prior to accessing the spray chamber the coolant must be drained which can lead to contamination and coolant loss. A further problem with conventional spray technology is that during acceleration, deceleration and attitude change, temporary coolant loss to the pump may occur thereby decreasing the efficiency of the spray system. An additional problem with conventional spray technology is that the pressure within the chamber varies greatly and is typically dependent solely upon the evaporation of coolant, dissolved gases in the coolant, volume of coolant in spray chamber, and temperature within the spray chamber without adequate control. Another problem with conventional spray technology is that if a leak within the spray system exists there is no automatic method for adding additional coolant to the spray system to compensate for the coolant loss. A further problem with conventional spray technology is that the seal of the spray chamber typically must be broken to fill or add coolant.

While these devices may be suitable for the particular purpose to which they address, they are not as suitable for increasing the efficiency and performance of a spray thermal management system. In these respects, the spray coolant reservoir system according to the present invention substantially departs from the conventional concepts and designs of the prior art, and in so doing provides an apparatus primarily developed for the purpose of increasing the efficiency and performance of a spray thermal management system.

BRIEF SUMMARY OF THE INVENTION

In view of the foregoing disadvantages inherent in the known types of spray thermal management systems now present in the prior art, the present invention provides a new spray coolant reservoir system construction wherein the same can be utilized for increasing the efficiency and performance of a spray thermal management system.

The general purpose of the present invention, which will be described subsequently in greater detail, is to provide a new spray coolant reservoir system that has many of the advantages of the spray thermal management systems mentioned heretofore and many novel features that result in a new spray coolant reservoir system which is not anticipated, rendered obvious, suggested, or even implied by any of the prior art spray thermal management systems, either alone or in any combination thereof.

To attain this, the present invention generally comprises a reservoir capable of storing a volume of coolant, a chassis with a spray chamber, a pump unit, an intake valve fluidly connected to the pump unit for providing coolant from the reservoir or the spray chamber, an output valve fluidly connected to the pump unit for controlling coolant flow from the pump unit to either the spray unit or the reservoir. The reservoir preferably includes a vent port, a fill port, and a chamber port. The chamber port is fluidly connected to the spray chamber for allowing control of the internal pressure within the spray chamber.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a spray coolant reservoir system that will overcome the shortcomings of the prior art devices.

A second object is to provide a spray coolant reservoir system for increasing the efficiency and performance of a spray thermal management system.

Another object is to provide a spray coolant reservoir system that provides supplemental coolant to compensate for leaks within the spray thermal management system.

An additional object is to provide a spray coolant reservoir system that is capable of receiving the coolant drained from a spray chamber prior to opening the spray chamber.

Another object is to provide a spray coolant reservoir system that does not require opening of the spray chamber to fill or add coolant.

A further object is to provide a spray coolant reservoir system that provides an auxiliary coolant supply for a coolant pump.

Another object is to provide a spray coolant reservoir system that ensures an adequate coolant supply to the pump during acceleration, deceleration and attitude changes.

Another object is to provide a spray coolant reservoir system that allows for manipulation of the internal pressure of the spray chamber thereby controlling coolant vaporization within the spray chamber.

A further object is to provide a spray coolant reservoir system that is capable of creating a negative pressure within the spray chamber to reduce coolant leakage.

A further object is to provide a spray coolant reservoir system that prevents excessive fluid retention within the spray chamber.

Another object is to provide a spray coolant reservoir system that allows an individual to conveniently monitor the coolant level.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIG. 10 is a block diagram illustrating the electrical connections and communications of the present invention.

DETAILED DESCRIPTION OF THE INVENTION

A. Overview

Figure 1:
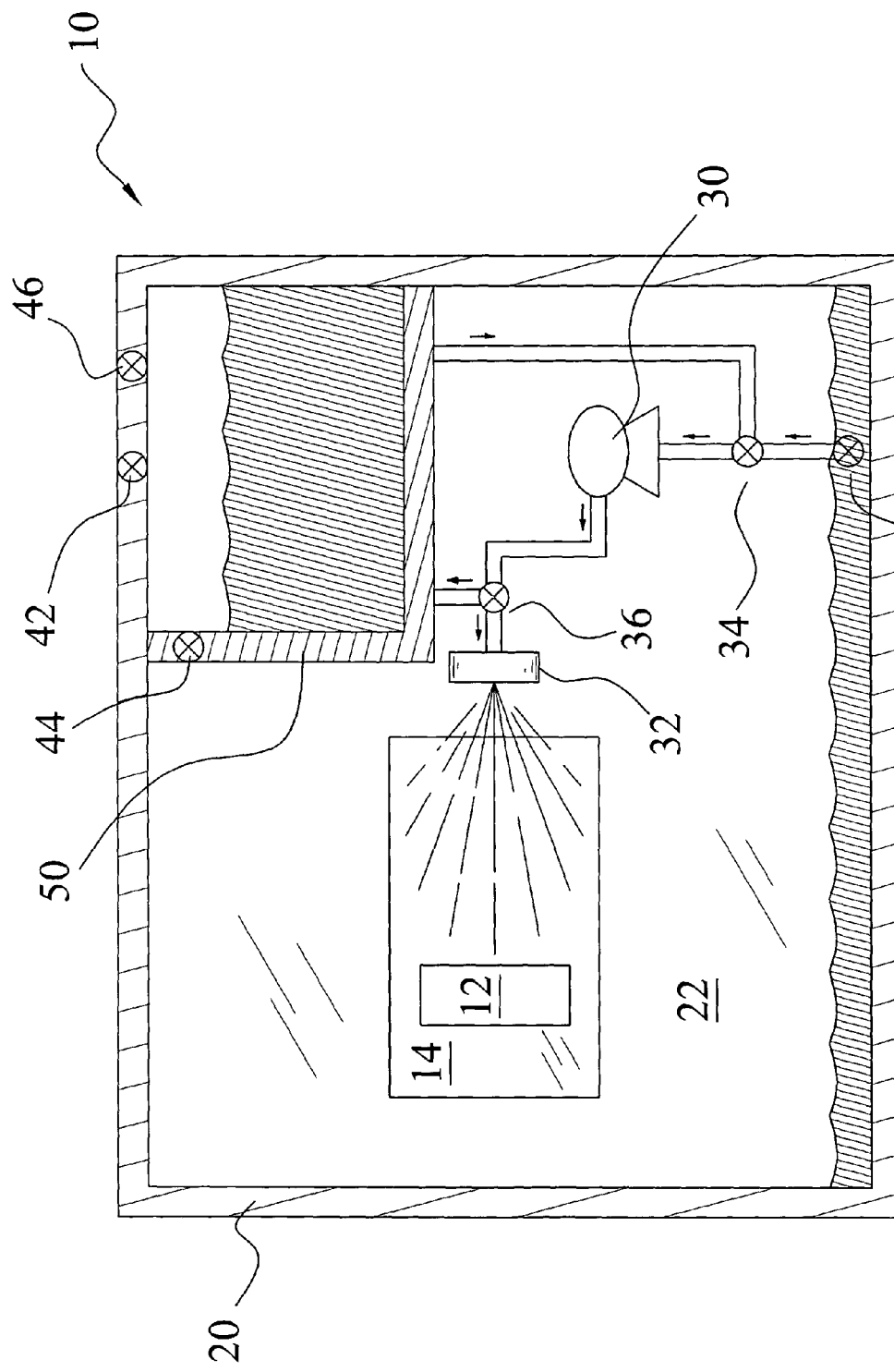
FIG. 1 is a side cutaway view of the present invention with the reservoir within the chassis.

Turning now descriptively to the drawings, in which similar reference characters denote similar elements throughout the several views, FIGS. 1 through 10 illustrate a spray coolant reservoir system 10, which comprises a reservoir 50 capable of storing a volume of coolant, a chassis 20 with a spray chamber 22, a pump unit 30, an intake valve 34 fluidly connected to the pump unit 30 for providing coolant from the reservoir 50 or the spray chamber 22, an output valve 36 fluidly connected to the pump unit 30 for controlling coolant flow from the pump unit 30 to either the spray unit 32 or the reservoir 50. The reservoir 50 preferably includes a vent port 42, a fill port 46, and a chamber port 44. The chamber port 44 is fluidly connected to the spray chamber 22 for allowing control of the internal pressure within the spray chamber 22.

B. Chassis

As shown in FIGS. 1, 3 through 6 of the drawings, the chassis 20 may have various shapes, structures and configurations. The chassis 20 illustrated in the drawings should not be interpreted to limit the scope of protection of the present invention. The chassis 20 may be freestanding or mounted into a rigid structure, such as but not limited to a network rack.

The chassis 20 includes at least one spray chamber 22 as shown in FIGS. 1, 3 through 6 of the drawings. The spray chamber 22 is selectively sealed by a door or panel structure which is well known in the art of spray technology.

The spray chamber 22 is designed to allow for liquid coolant to contact electronic devices such as but not limited to electronic card members 12 thereby conducting the thermal energy generated by the card members 12. The card members 12 may be retained within a card cage 14 or similar structure for support and protection. The card members 12 positioned within the spray chamber 22 must be capable of being positioned within a dielectric coolant which is also well-known in spray technology.

C. Reservoir

As FIGS. 1 through 6 illustrate, a reservoir 50 is provided within the present invention. The reservoir 50 is capable of storing a volume of coolant and is fluidly connected to the coolant system. The reservoir 50 is capable of receiving excess coolant from the spray chamber 22. The reservoir 50 is also capable of providing coolant to the spray chamber 22 when coolant levels within the spray chamber 22 fall below a specified level.

FIG. 1 illustrates the reservoir 50 within the chassis 20 or the spray chamber 22. However the reservoir 50 may be positioned external of the chassis 20 as shown in FIGS. 3 through 6 of the drawings.

The reservoir 50 preferably includes a fill port 46 and a drain port 48. The fill port 46 allows for selective filling of the reservoir 50 with coolant and the drain port 48 allows for selective draining of coolant from the reservoir 50.

Figure 3:
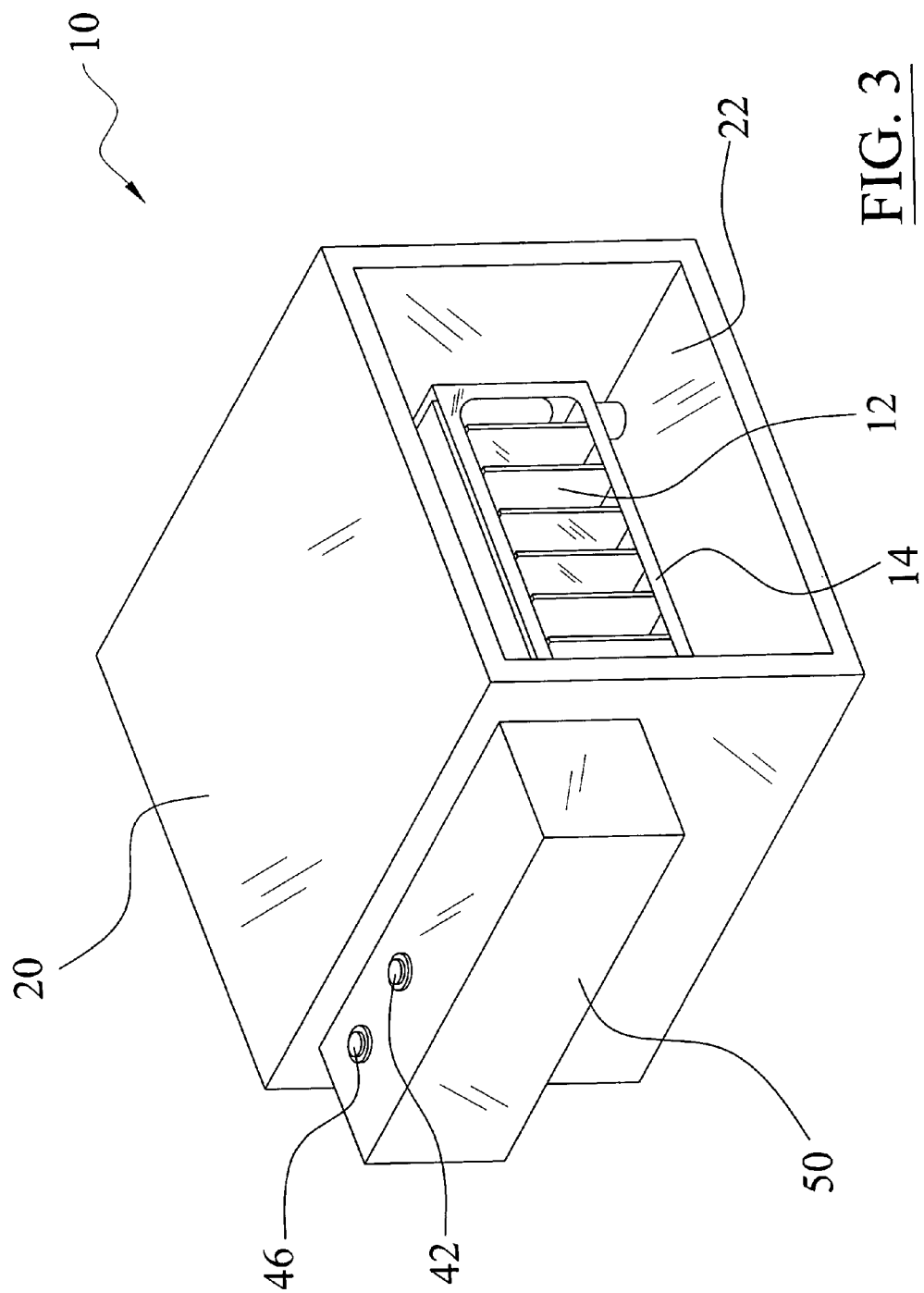
FIG. 3 is an upper perspective view of the present invention with an exposed spray chamber and with the reservoir external of the chassis.
Figure 4:
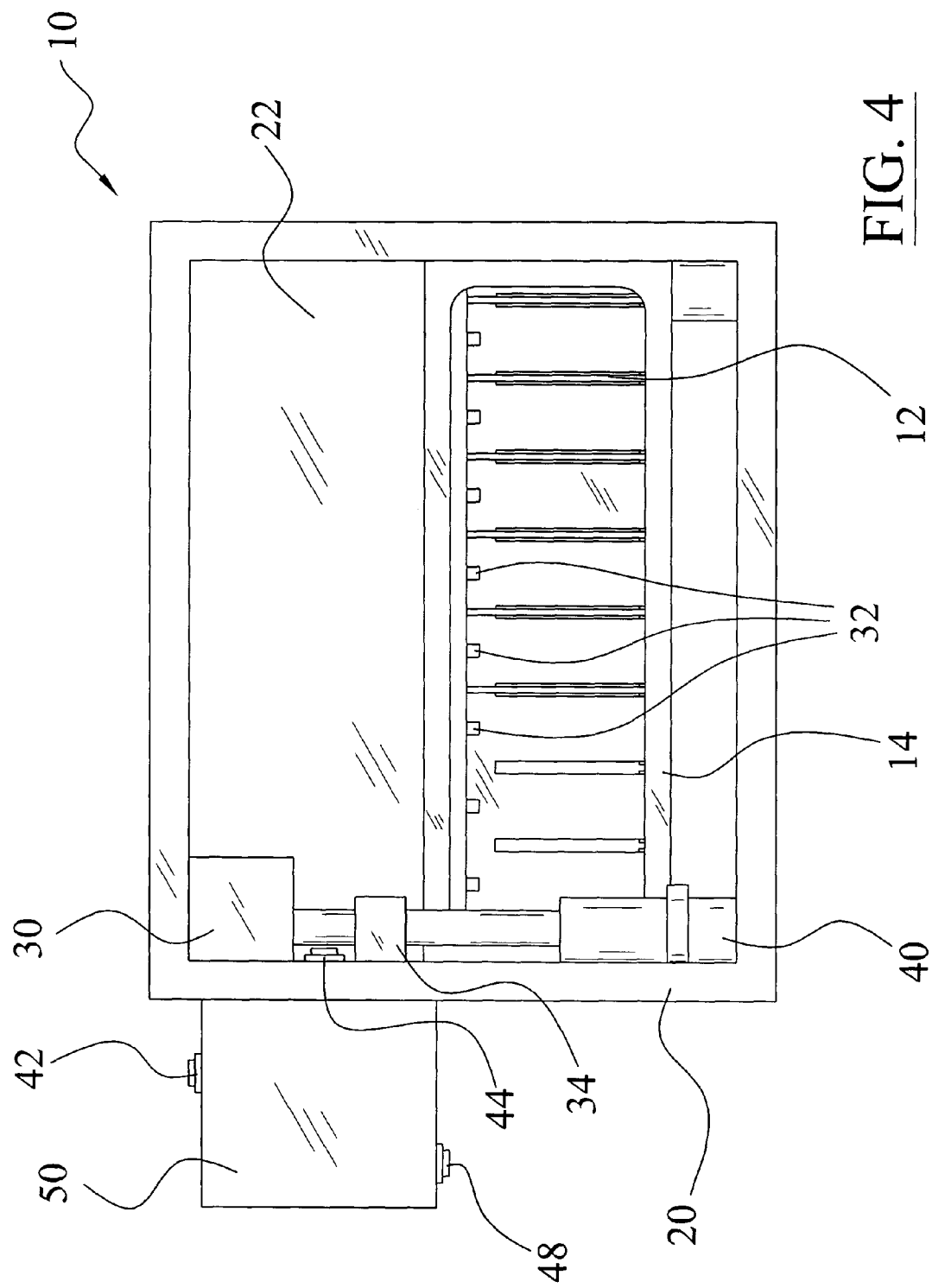
FIG. 4 is a side view of the present invention with an exposed spray chamber.
Figure 5:
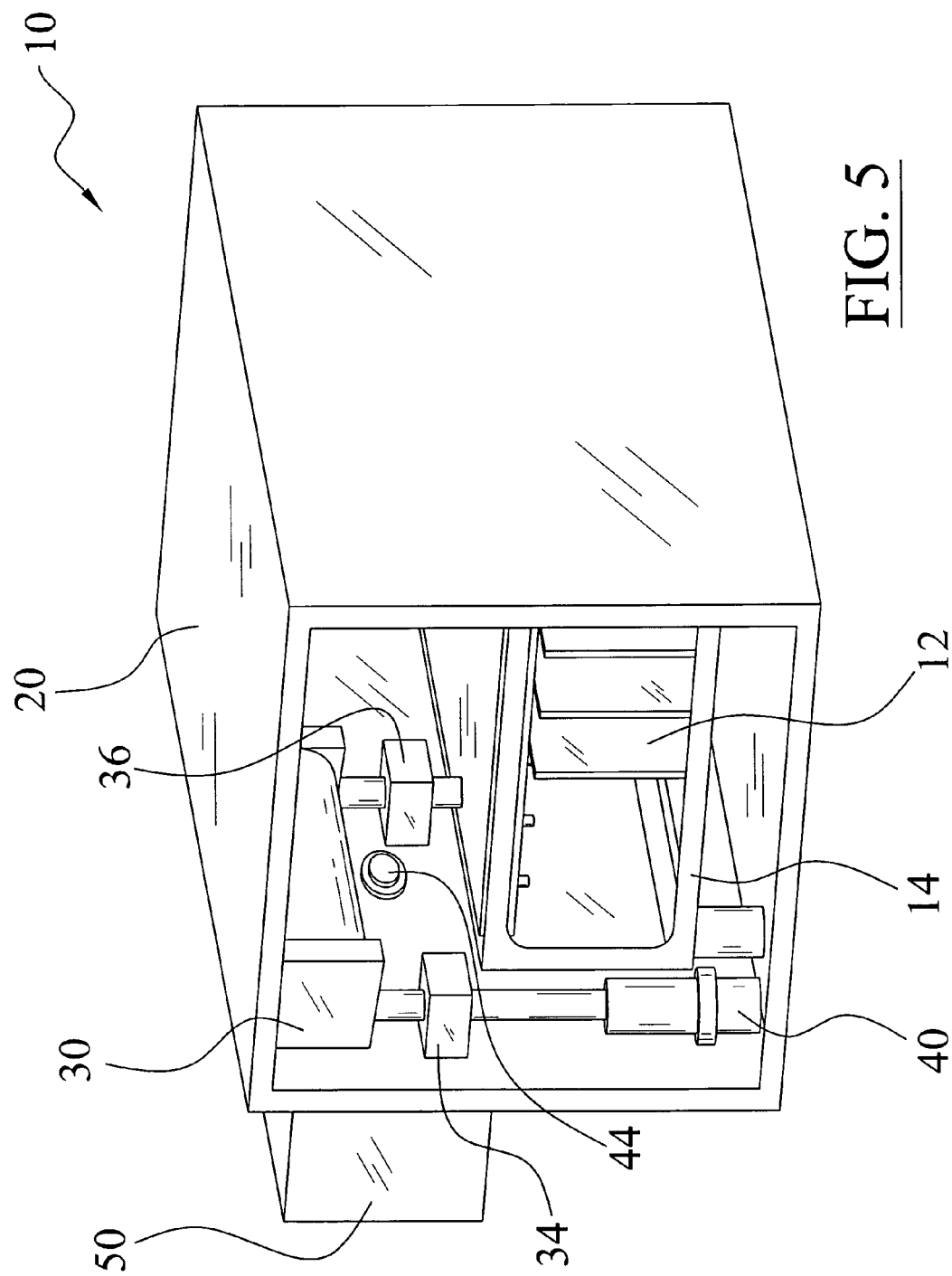
FIG. 5 is an upper perspective view of the present invention with an exposed spray chamber.
Figure 6:
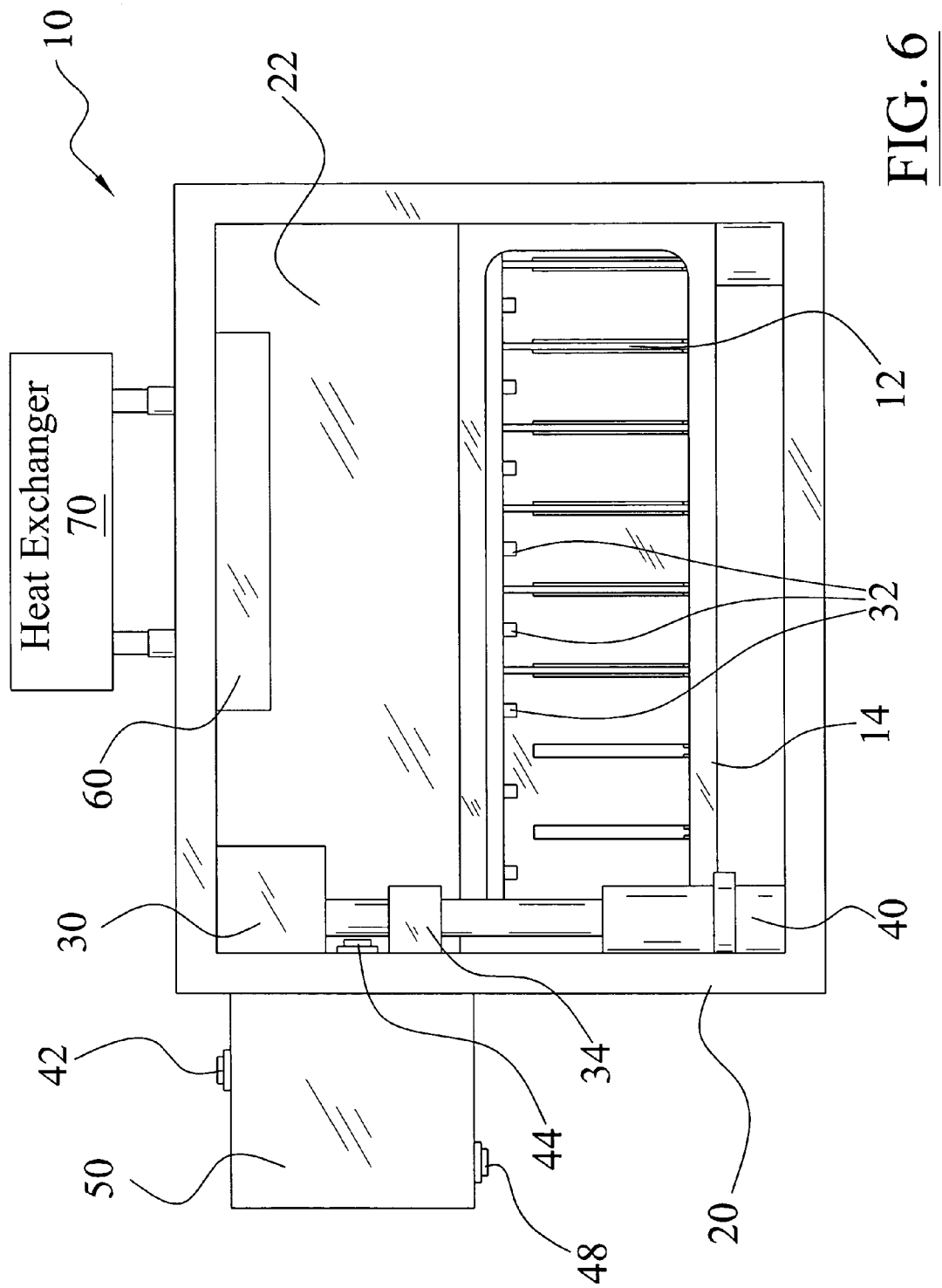
FIG. 6 is a side view of the present invention with an internal condenser within the spray chamber.

The reservoir 50 preferably includes a vent port 42 as shown in FIGS. 1 and 3 of the drawings. The vent port 42 allows for the selective release of gas pressure within the reservoir 50. The vent port 42 also allows for the selective entry of air into the reservoir 50. During normal operation, the vent port 42 is preferably closed.

The reservoir 50 preferably includes a chamber port 44 fluidly connected to spray chamber 22 as shown in FIGS. 1, 4, 5 and 6 of the drawings. When the chamber port 44 is opened, the pressures within the spray chamber 22 and the reservoir 50 become equalized. During normal operation the chamber port 44 is preferably closed.

D. Coolant System

The coolant system is fluidly connected to the spray unit 32, the spray chamber 22 and the reservoir 50. The coolant system preferably provides pressurized and thermally managed coolant to the spray unit 32. U.S. Pat. Nos. 5,220,804 and 6,108,201 illustrate spray technology that may be utilized within the present invention and are hereby incorporated by reference into this application.

Figure 2:
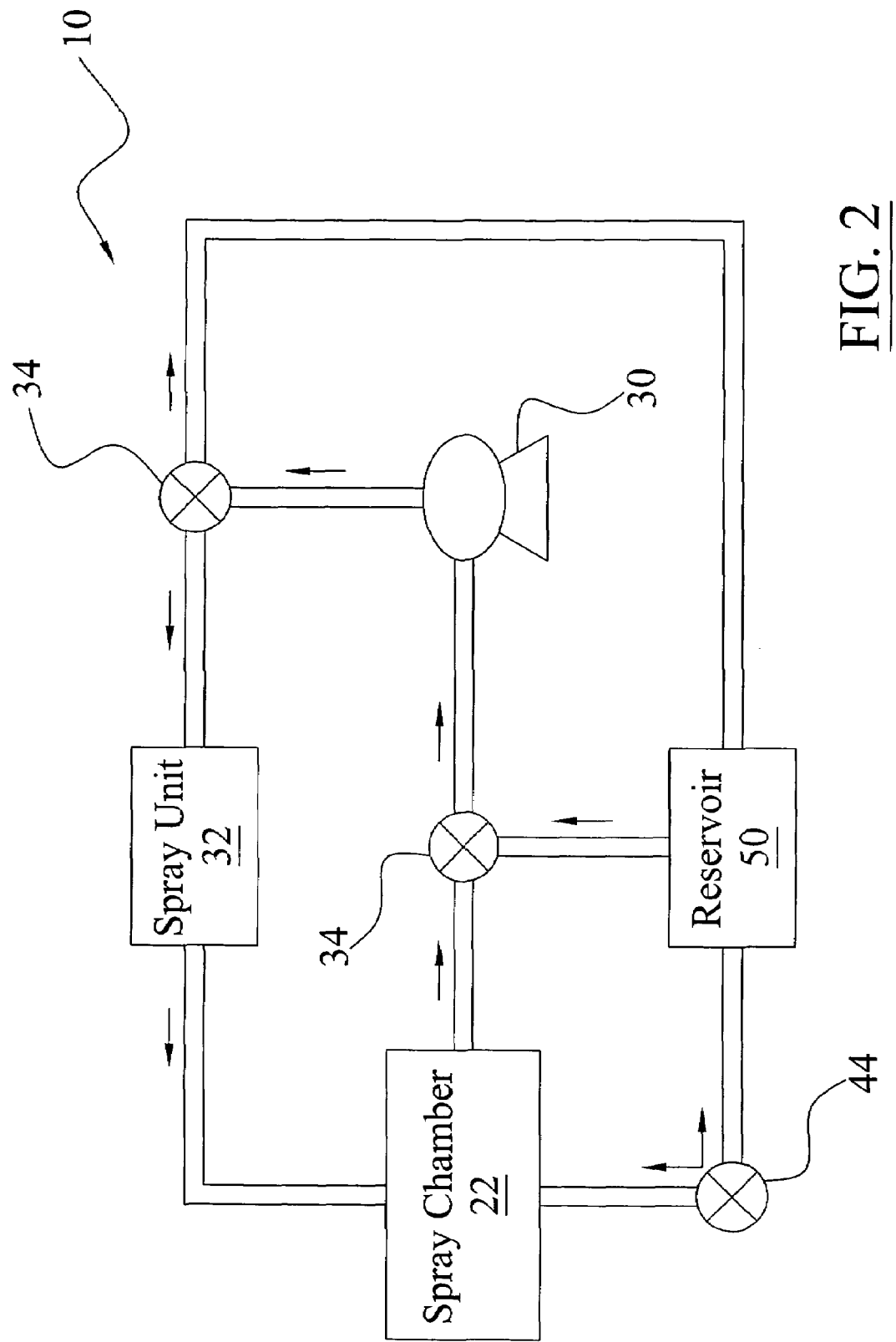
FIG. 2 is a block diagram illustrating the fluid connections and coolant flow within the present invention.

As shown in FIGS. 1 and 2 of the drawings, an intake valve 34 is fluidly connected to the coolant system for providing coolant to the coolant system. The intake valve 34 is also fluidly connected to the spray chamber 22 and to the reservoir 50 as further shown in FIGS. 1 and 2. A pickup valve 40 or similar device is preferably positioned within the spray chamber 22 for drawing the waste coolant out of the spray chamber 22 as shown in FIG. 1 of the drawings.

Figure 7:
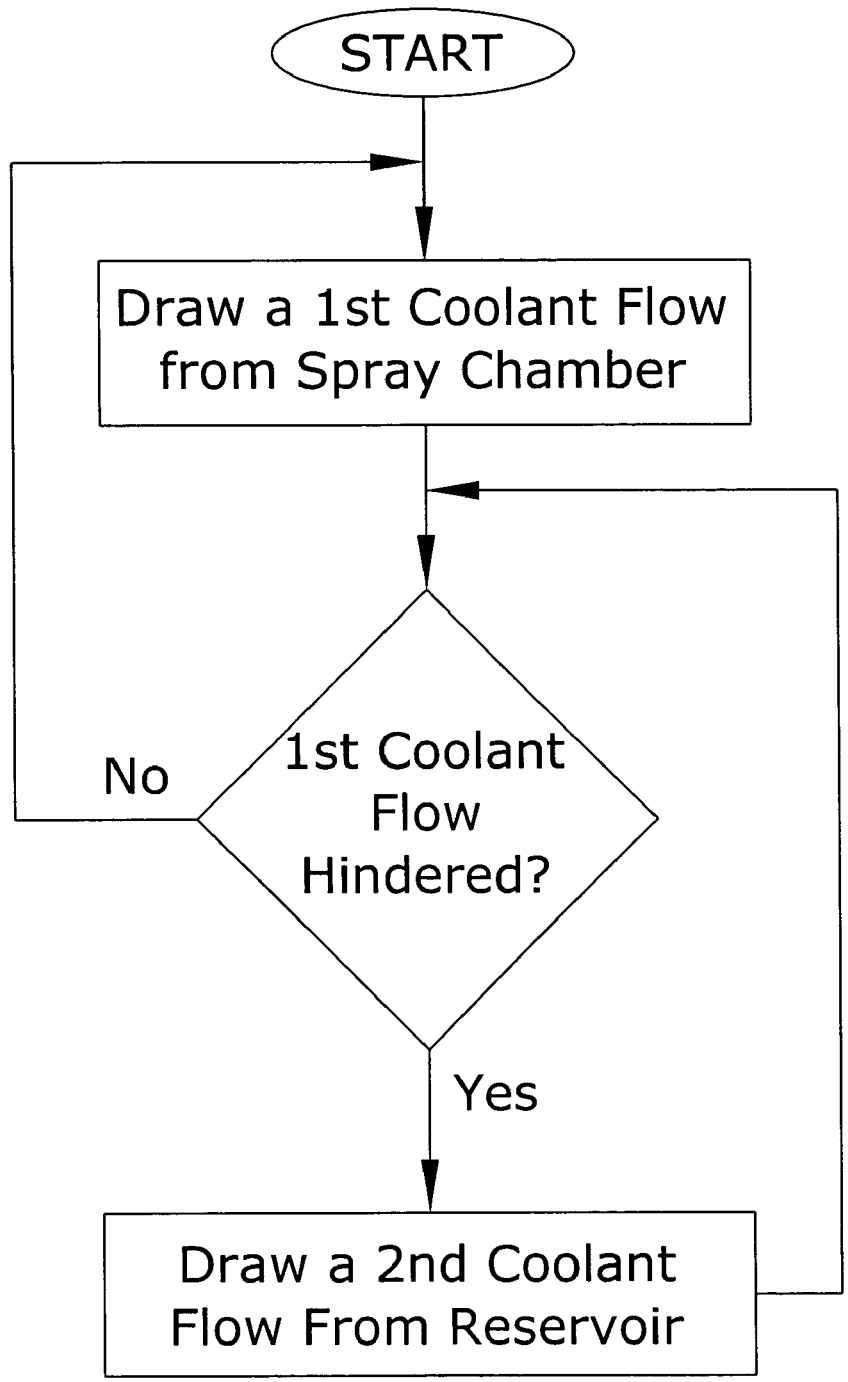
FIG. 7 is a flowchart illustrating the coolant flow within the present invention.

The intake valve 34 diverts a coolant input flow to the coolant system from the reservoir 50 when coolant flow from the spray chamber 22 is hindered as shown in FIG. 7 of the drawings. Coolant flow from the spray chamber 22 may be hindered when there is no coolant flow or reduced coolant flow from the spray chamber 22 due to various factors such as but not limited to acceleration, deceleration and attitude change. The intake valve 34 preferably allows coolant input flow to the coolant system solely from the spray chamber 22 during normal operation, and solely or jointly from the reservoir 50 when coolant flow from the spray chamber 22 is hindered.

An output valve 36 is fluidly connected to the coolant system opposite of the input valve as shown in FIGS. 1 and 2 of the drawings. The output valve 36 is fluidly connected to the spray unit 32 and to the reservoir 50 for providing pressurized fluid from the coolant system to the same. The output valve 36 preferably allows coolant output flow solely to the spray unit 32 from the coolant system during normal operation. However, when excess coolant is present within the spray chamber 22, the output valve 36 may divert the coolant output flow to the reservoir 50 to fill the reservoir 50.

As shown in FIGS. 1 and 2 of the drawings, the coolant system preferably includes a pump unit 30 that is fluidly connected between the intake valve 34 and the output valve 36. The pump unit 30 may be comprised of various well-known pump technologies.

A condenser 60 is also preferably provided that may be positioned internally or externally of the spray chamber 22 for condensing vaporized coolant. The condenser 60 is connected to a heat exchanger 70 which reduces the temperature of the condenser 60 which is well known in the art. Filters, thermal management units and related devices may also be included within the coolant system though not shown in the drawings.

E. Control Unit

As shown in FIG. 10 of the drawings, a control unit 38 is provided that is in communication with the coolant system, the pump unit 30, the intake valve 34, the output valve 36, the pickup valve 40, the vent port 42, the drain port 48, the fill port 46, the chamber port 44, the heat exchanger 70, the condenser 60, the sensors 39 and any other related electronic device. The sensors 39 are capable of measuring various conditions such as but not limited to coolant temperature, electronic device temperature, coolant levels (in spray chamber 22 and in the reservoir 50), coolant flow, pressure (in spray chamber 22 and in the reservoir 50), the attitude of the chassis 20 and other related conditions.

The control unit 38 may be comprised of various electronic technologies such as but not limited to computer devices. The control unit 38 is preferably programmable and capable of receiving and transmitting data. More than one control unit 38 may be utilized with the present invention. In addition, some of the devices within the present invention may be in direct or indirect communication with one another.

F. Controlling Coolant Flow

As shown in FIG. 7 of the drawings, the coolant is first drawn from the spray chamber 22 to provide a supply coolant flow to the spray unit 32. However, if the coolant flow from the spray chamber 22 is hindered (e.g. stopped or reduced), then the coolant is drawn from the reservoir 50 until coolant flow from the spray chamber 22 is no longer hindered as shown in FIG. 7 of the drawings. It is preferably to terminate the coolant flow from the spray chamber 22 when drawing coolant from the reservoir 50, however the coolant may be drawn simultaneously from both the reservoir 50 and the spray chamber 22.

If the spray chamber 22 has excess coolant, it is desirable to divert all or a portion of the coolant flow from the pump unit 30 to the reservoir 50 by the output valve 36 until a desired coolant level is achieved within the spray chamber 22. Alternatively, if the coolant level within the spray chamber 22 falls below a desired level (e.g. leakage problems), all or a portion of the coolant drawn into the pump may be supplied by the reservoir 50 by the intake valve 34.

G. Controlling Spray Chamber Pressure

1. Overview

It is desirable to control the pressure within the spray chamber 22 for various reasons. For example, reducing pressure within the spray chamber 22 will allow removal of noncondensable gasses which will lower the vaporization temperature, thus increasing performance. Also, increased pressure within the spray chamber 22 facilitates condensing of the coolant at higher temperatures.

2. Reducing Spray Chamber Pressure

Figure 8:
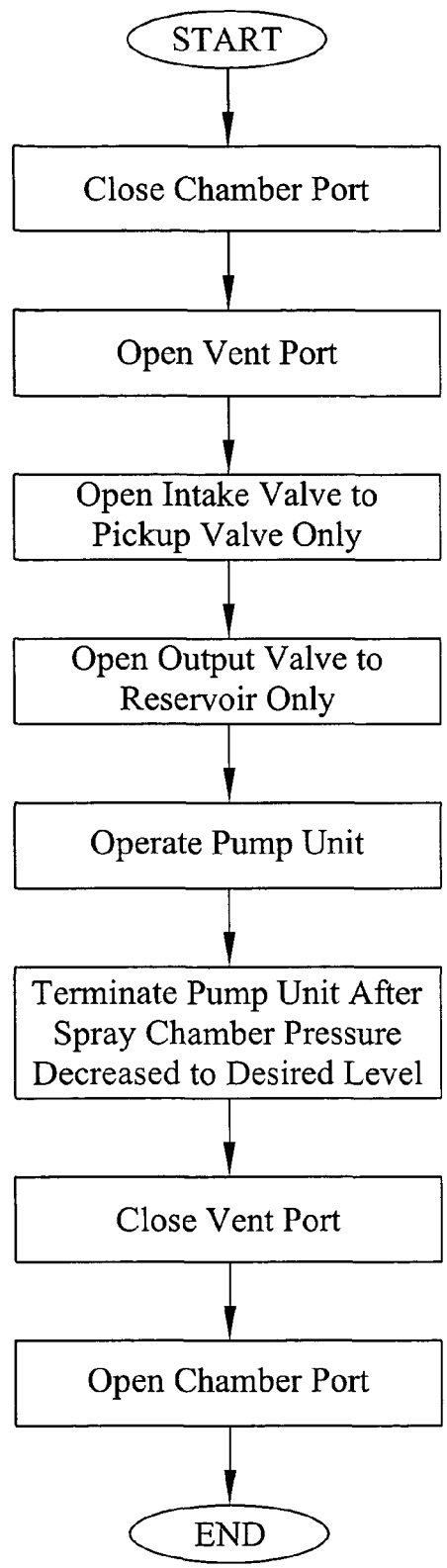
FIG. 8 is a flowchart illustrating the process for reducing the spray chamber pressure.

FIG. 8 illustrates an exemplary process for reducing the pressure within the spray chamber 22. First, the chamber port 44 is closed if not already closed. Second, the vent port 42 is then opened and the intake valve 34 is switched to draw fluid only from the pickup valve 40 within the spray chamber 22. Next, the output valve 36 is switched to provide pressurized coolant from the pump unit 30 solely to the reservoir 50 only.

The pump unit 30 is then operated which draws coolant from within the spray chamber 22 and forcing the fluid into the reservoir 50. As the coolant is drawn out of the spray chamber 22, the pressure within the spray chamber 22 is reduced (even to the level of negative pressure). As the coolant is forced into the reservoir 50, the vent port 42 allows the displaced gases within the reservoir 50 to escape into the atmosphere or other structure. The vent port 42 also prevents an increase in the pressure of the reservoir 50 during this process.

Once the desired reduced pressure within the spray chamber 22 has been achieved, the pump unit 30 is terminated and the vent port 42 is closed as shown in FIG. 8 of the drawings. The chamber port 44 is then opened to allow for equalization of the pressures within the spray chamber 22 and the reservoir 50 as further shown in FIG. 8 of the drawings.

If the coolant level within the spray chamber 22 has dropped below a desired level, coolant from the reservoir 50 may be input back into the spray chamber 22 with the chamber port 44 open to prevent an increase in pressure within the spray chamber 22 or without the chamber port 44 open. The chamber port 44 may then be closed to allow for normal operation of the present invention.

3. Increasing Spray Chamber Pressure

Figure 9:
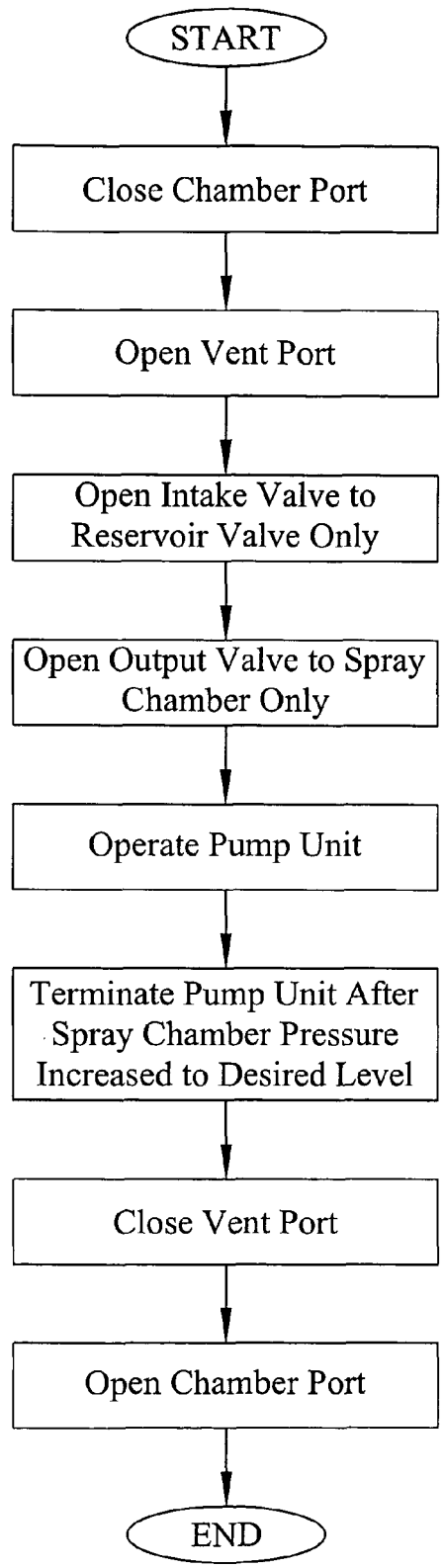
FIG. 9 is a flowchart illustrating the process for increasing the spray chamber pressure.

FIG. 9 illustrates an exemplary process for increasing the pressure within the spray chamber 22. First, the chamber port 44 is closed if not already closed. Second, the vent port 42 is then opened and the intake valve 34 is switched to draw fluid only from the reservoir 50 only. Next, the output valve 36 is switched to provide pressurized coolant from the pump unit 30 solely to the spray chamber 22 only. The coolant may be provided into the spray chamber 22 via the spray unit 32 or a direct port.

The pump unit 30 is then operated which draws coolant from within the reservoir 50 and forcing the fluid into the spray chamber 22. As the coolant is forced into the spray chamber 22, the pressure within the spray chamber 22 is increased. As the coolant is forced into the spray chamber 22, the vent port 42 allows for air to enter the reservoir 50 to displace the reduced coolant thereby preventing a reduced pressure within the reservoir 50.

Once the desired increased pressure within the spray chamber 22 has been achieved, the pump unit 30 is terminated and the vent port 42 is closed as shown in FIG. 9 of the drawings. The chamber port 44 is then opened to allow for equalization of the pressures within the spray chamber 22 and the reservoir 50 as further shown in FIG. 9 of the drawings.

If the coolant level within the spray chamber 22 has increased above a desired level, coolant from the spray chamber 22 may be input back into the reservoir 50 with the chamber port 44 open to prevent a decrease in pressure within the spray chamber 22 or without the chamber port 44 open. The chamber port 44 may then be closed to allow for normal operation of the present invention.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A spray coolant reservoir system, comprising:
   a chassis having a spray chamber;
   a spray unit within said spray chamber for dispensing coolant upon an item to be thermally managed;
   a coolant system including a pump having an intake port and an output port, wherein said output port is fluidly connected to said spray unit, wherein said intake port of said pump is fluidly connected to said spray chamber, wherein said coolant system provides pressurized coolant to said spray unit;
   a reservoir fluidly connected to said output port of said pump, wherein said reservoir is capable of storing a volume of coolant; and
   a control system in communication with said coolant system and said reservoir for controlling a flow of coolant between said reservoir and said coolant system.

2. The spray coolant reservoir system of claim 1, including an intake valve fluidly connected to said coolant system, wherein said intake valve is also fluidly connected to said spray chamber and to said reservoir.

3. The spray coolant reservoir system of claim 2, wherein said intake valve diverts coolant input flow to said coolant system from said reservoir when coolant flow from said spray chamber is hindered.

4. The spray coolant reservoir system of claim 2, wherein said intake valve allows coolant input flow to said coolant system solely from said spray chamber during normal operation and from said reservoir when coolant flow from said spray chamber is hindered.

5. The spray coolant reservoir system of claim 2, wherein said intake valve allows coolant input flow to said coolant system solely from said spray chamber during normal operation and jointly from said reservoir when coolant flow from said spray chamber is hindered.

6. The spray coolant reservoir system of claim 1, including an output valve fluidly connected to said output port of said pump, wherein said output valve is also fluidly connected to said spray unit and to said reservoir.

7. The spray coolant reservoir system of claim 6, wherein said output valve allows coolant output flow solely to said spray unit from said coolant system during normal operation.

8. The spray coolant reservoir system of claim 6, wherein said output valve diverts coolant output flow from said coolant system to said reservoir to fill said reservoir.

9. The spray coolant reservoir system of claim 1, wherein said reservoir includes a chamber port fluidly connected to spray chamber for selectively allowing pressure equalization.

10. The spray coolant reservoir system of claim 1, wherein said reservoir is positioned within said chassis.

11. The spray coolant reservoir system of claim 1, wherein said reservoir is positioned external of said chassis.

12. The spray coolant reservoir system of claim 1, wherein said reservoir includes a fill port and a drain port.

13. The spray coolant reservoir system of claim 1, wherein said reservoir includes a vent port.

14. A method of operating a spray coolant reservoir system, said method comprising the steps of:
   (a) drawing a first coolant flow from a spray chamber to provide a supply coolant flow to a spray unit positioned within said spray chamber; and
   (b) drawing a second coolant flow from a reservoir to provide said supply coolant flow to said spray unit only if said first coolant flow is hindered.

15. The method of operating a spray coolant reservoir system of claim 14, wherein step (b) includes terminating said first coolant flow.

16. The method of operating a spray coolant reservoir system of claim 14, including diverting said supply coolant flow from said spray unit to said reservoir to fill said reservoir.

17. A method of controlling pressure within a spray chamber using a reservoir, said method comprising the steps of:
   (a) closing a chamber port fluidly connected between a reservoir and a spray chamber;
   (b) opening a vent port within said reservoir;
   (c) opening an intake valve to said spray chamber if reducing a spray chamber pressure or opening said intake valve to said reservoir if increasing said spray chamber pressure;
   (d) opening an output valve to said reservoir if reducing said spray chamber pressure or opening said output valve to said spray chamber if increasing said spray chamber pressure;
   (e) operating a pump unit fluidly connected between said intake valve and said output valve; and
   (f) terminating said pump unit after said spray chamber pressure attains a desired pressure level.

18. The method of controlling pressure within a spray chamber using a reservoir of claim 17, including the following steps:
   (g) closing said vent port; and
   (h) opening said chamber port.

* * * * *